(12) United States Patent
Rougeot

(10) Patent No.: US 6,723,995 B2
(45) Date of Patent: Apr. 20, 2004

(54) DIRECT CONVERSION FLAT PANEL X-RAY DETECTOR WITH AUTOMATIC CANCELLATION OF GHOST IMAGES

(75) Inventor: Henri Rougeot, Sollies-Pont (FR)

(73) Assignee: FTNI Inc., Montreal (CA)

( * ) Notice: Subject to any disclaimer, the term of this patent is extended or adjusted under 35 U.S.C. 154(b) by 237 days.

(21) Appl. No.: 10/005,963

(22) Filed: Dec. 7, 2001

(65) Prior Publication Data

US 2003/0107002 A1 Jun. 12, 2003

(51) Int. Cl.[7] ................................................. G01T 1/24
(52) U.S. Cl. ................................................. 250/370.11
(58) Field of Search ....................... 250/370.11, 370.13, 250/370.14, 370.08, 370.09

(56) References Cited

U.S. PATENT DOCUMENTS

| | | | |
|---|---|---|---|
| 4,554,453 A | 11/1985 | Feigt et al. | 250/327.2 |
| 5,132,541 A | 7/1992 | Conrads et al. | 250/370.01 |
| 5,396,072 A | 3/1995 | Schiebel et al. | 250/370.09 |
| 5,796,113 A | 8/1998 | Nagli et al. | 250/483.1 |
| 5,880,472 A | 3/1999 | Polischuk et al. | 250/370.09 |
| 6,078,053 A | 6/2000 | Adam et al. | 250/370.09 |
| 6,353,229 B1 * | 3/2002 | Polischuk et al. | 250/370.14 |
| 2002/0134944 A1 * | 9/2002 | Arakawa | 250/370.11 |

OTHER PUBLICATIONS

Lee, D.L., Cheung, L.K., Jeromin, L.S.; A New Digital Detector for Projection Radiography; Feb. 26–27, 1995; pp 237–249; San Diego, CA.

* cited by examiner

Primary Examiner—John D. Lee
Assistant Examiner—Christopher M. Kalivoda
(74) Attorney, Agent, or Firm—George J. Primak

(57) ABSTRACT

The invention provides a direct conversion flat panel X-ray detector with automatic cancellation of ghost images due to charge trapping. The detector includes a direct X-ray to charge converter, a readout thin film transistor array supported by a glass substrate and on the rear side of the glass substrate, a layer of luminophor which automatically and instantly suppresses the ghosting effect.

20 Claims, 3 Drawing Sheets

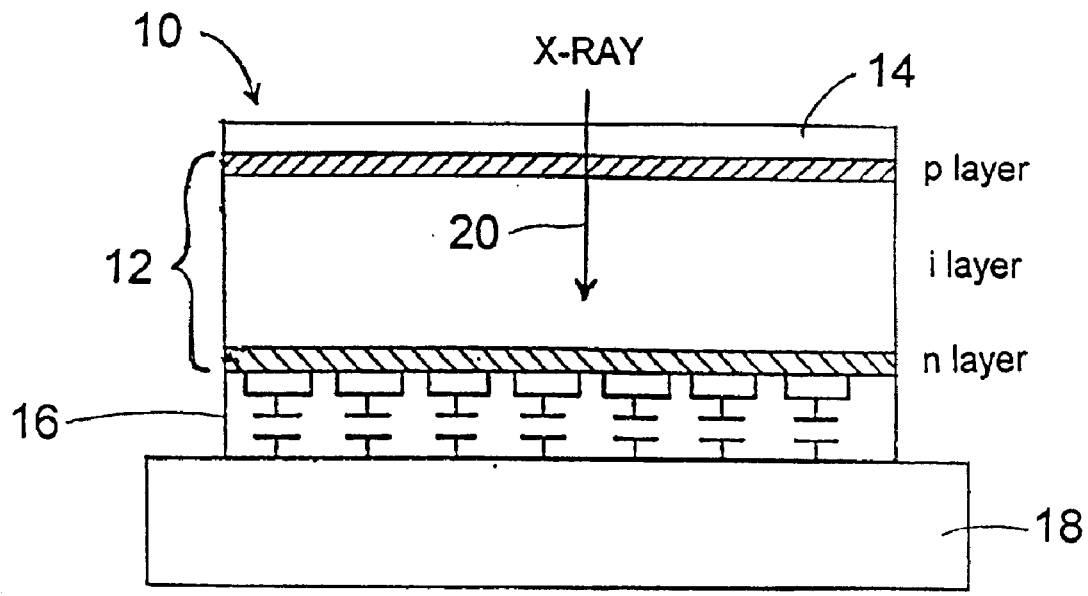
Fig. 1 (Prior Art)
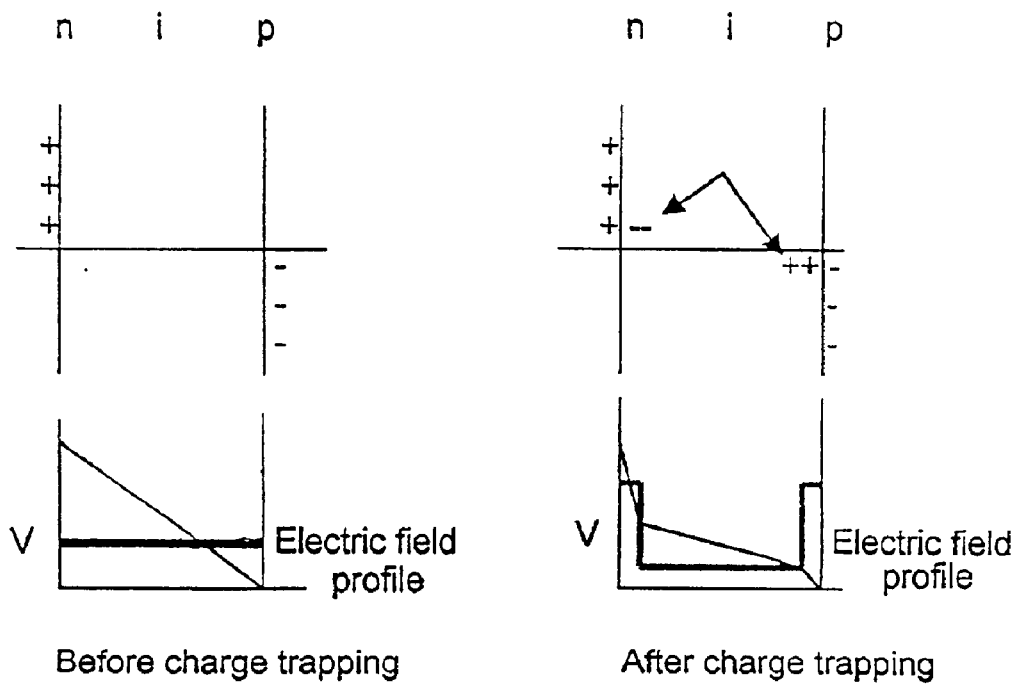
Before charge trapping
Fig. 2A
After charge trapping
Fig. 2B

DIRECT CONVERSION FLAT PANEL X-RAY DETECTOR WITH AUTOMATIC CANCELLATION OF GHOST IMAGES

BACKGROUND OF THE INVENTION

1. Field of the Invention

This invention relates to a structure of a direct conversion flat panel X-ray detector that provides for automatic cancellation of ghost images. More particularly, the invention relates to an X-ray image flat panel detector comprising a direct X-ray to charge converter, a readout thin film transistor array and a transparent substrate, in which the after image or ghosting effect, due to charge trapping within the charge converter, is automatically and instantly suppressed by a provision of a layer of luminophor on the rear of the substrate.

2. Description of the Prior Art

During the last 15 years, many efforts have been directed towards the development of digital detectors for X-ray imaging. These detectors benefit from a much wider dynamic range and improved detection efficiency than film, allowing for much better imaging quality. These emerging detectors can be divided into two groups, one group where the X-rays are converted into light photons which are then detected by a light sensitive device i.e. luminophor screen+ photodiodes or charge coupled device (CCD), and the other group where the X-rays are directly converted into electric charges, i.e. direct detection by a semi-conductor such as silicon, germanium, cadmium telluride, thallium bromide or amorphous material like selenium.

The use of selenium as a direct converter, meaning direct generation of electrical charges under X-ray exposure, simplifies the structure of the detector leading to substantial improvement in production yield and cost. It also has performance advantages such as resolution and sensitivity. Nevertheless, the collection of these electrical charges requires the use of substantial electric fields and can be incomplete because of trapping effects leading to image retention and ghosting. As described in U.S. Pat. No. 5,880,472 by Bradley Trent Polischuk and Alain Jean, the selenium direct converter has a multilayer structure consisting of "p", "i" and "n" layers. The "p" and "n" layers are no more than a few micrometers thick; their role is to block the injection of electrons and holes respectively, allowing for a low dark current under high voltage polarization. The X-ray-to-charge conversion takes place in the thick "i" layer. The ghosting effect results from charges captured in and released from traps located within the "i" selenium converter material as well as in the interfaces of the "pin" structure. Each trap is associated with a charging and discharging time depending on its energy depth within the amorphous selenium energy gap between a conduction band and a valence band or within trap states located in the "ip" and "ni" interfaces. Shallow traps with release time less than a few microseconds are insignificant (<0.5 eV). Deep traps (about >0.7 eV) which release their charges within a very long time can build up a residual background image which will be detrimental to applications in which switching from intense to low X-ray flux is required, such as in angiography applications.

In indirect converters, most of the after image effect is the result of light emission variations over the emitting surface of the scintillator. It translates into a background non-uniformity which can be instantly compensated for by the addition of an offset in the processing of the image.

In direct converters, such as those using selenium, a significant part of the after image is the result of sensitivity variations under the effect of trapped charges. Such trapped charges whether in the "in" interface, "pi" interface or in the bulk of the "i" layer, tend to locally modify the electric field profile and thus to change the collection rate. It results in a gain variation and can only be corrected for electronically by tedious and time consuming multiplication operations over the entire array.

In U.S. Pat. No. 5,132,541 by Conrads et al. entitled "Sensor Matrix", a direct converter flat panel detector of a similar structure is described. Nevertheless, the charge trapping effect is ignored and no correction method is proposed.

In U.S. Pat. No. 5,396,072 by Schiebel et al. entitled "X-Ray Image Detector" a direct converter flat panel detector is again described showing ways to avoid capacitance coupling with the collecting leads. There is no mention of image ghosting nor of ways to avoid image retention by charge trapping.

In U.S. Pat. No. 5,880,472, already mentioned above, a selenium multilayer structure allowing real time imaging capabilities is disclosed. However, no indication of the level of image retention or of the means by which this effect can be eliminated is given.

In U.S. Pat. No. 6,078,053 by Adam et al., an X-ray image erasure method is disclosed according to which ghost images are erased by simultaneous application of high voltage and light to the X-ray imaging device. However, it provides no automatic cancellation of such ghost images by the actual structure of the device.

Finally, in a paper by Lee D. L., Cheung L. K., and Jeromin L. S., entitled "A New Digital Detector for Projection Radiography", 1995, SPIE Vol. 2432, pp. 237–249, a direct conversion selenium based thin film transistor (TFT) imaging system is disclosed where a burst of light is triggered to reset the panel after readout, once the high voltage has been switched off. However, this technique, required only to cancel the stored image signal, though it may simultaneously release trapped charges, suffers from the fact that it cannot be used for real time imaging applications, such as in angiography.

There is thus a need for a structure that would provide automatic cancellation of ghost images in direct conversion detectors.

OBJECTS AND SUMMARY OF THE INVENTION

It is an object of the present invention to design a structure of a flat panel direct conversion X-ray detector that provides for automatic cancellation of ghost images.

Another object of the present invention is to apply such structure to selenium flat panel X-ray detectors.

Other objects and advantages of the invention will be apparent from the following description thereof.

The present invention uses the incomplete X-ray absorption and subsequent partial transmission of the converter layer of the flat panel detector, such as an amorphous selenium layer, and of its substrate, to stimulate a luminophor provided on the back of said substrate. It uses as well the light emitted by the luminophor and transmitted through the TFT array built on the glass or other transparent substrate to reach the selenium "pin" structure and release the trapped charges. More specifically, as the non-absorbed X-ray beam impinges on the luminophor located on the rear of the transparent substrate, light is generated, which, by transmission through the TFT array, instantly inhibits any trapping of charges, preventing any subsequent alteration of the electric field topography and thus the ghosting effect. Moreover, the trap inhibition process is self controlled. Indeed, if the trapping increases locally as a result of increased X-ray flux, the generated light intensifies and the de-trapping rate increases. To be efficient, the light spectrum emitted by the luminophor should match the absorption spectrum of the traps. Taking into account the energy gap of amorphous selenium, the depth of the traps and the energy level of the interface states of the "pin" structure, the wavelength of the luminophor will normally extend from 580 nm to 620 nm. To provide for a minimum transmission through the TFT array, it is desirable that its architecture comprise pixel pads and electrodes made out of transparent conductors such as Indium Tin Oxide (ITO) or that the fill factor of the pixels be partial in order to allow light to flow through the voids. A fill factor of 70% is about the best that can be achieved in current TFT technology process. It allows up to 30% of the light generated by the luminophor to reach the selenium structure, which is sufficient when using a luminophor of average conversion efficiency.

It is already known to use a luminophor for improved recording of X-ray images, as disclosed in U.S. Pat. No. 4,554,453 by Feigt et al. Also, it is known to use a patterned luminophor in a method of X-ray image acquisition by exciting such luminophor with X-ray radiation to emit light by luminescence, as disclosed in U.S. Pat. No. 5,796,113 by Nagli et al. It is, however, unknown and surprising that a luminophor could be made part of a flat panel direct conversion X-ray detector to achieve automatic cancellations of ghost images that would otherwise be produced by such detector.

In greater detail, a preferred embodiment of the present invention provides a direct conversion flat panel X-ray detector with means for automatic cancellation of ghost images, which comprises:

(a) an X-ray to charge converter with a common coplanar electrode;

(b) an array of storage capacitors, having a top electrode which collects the charges delivered by the converter;

(c) a thin film transistor (TFT) matrix wherein each TFT "source" is connected to a corresponding capacitor upper electrode and TFT gate electrode is connected to a line lead common to all TFT gates of a same line as its "drain" which is connected to a readout column lead common to all TFT drains of a same column;

(d) a transparent substrate having a front side and a rear side and on its front side supporting the TFT matrix; and (e) a layer of luminophor on the rear side of the substrate adapted to emit light under impact of X-ray flux transmitted through the substrate, suitable for automatic cancellation of ghost images that may be trapped in the X-ray to charge converter.

The X-ray to charge converter may be, for example, a thick layer of cadmium telluride or of cadmium selenide, or of thallium bromide or of lead oxide or of amorphous selenium.

The array of storage capacitors and readout TFTs may be encapsulated in a transparent insulator provided with an array of transparent charge collecting pads made of ITO. Also, the array of storage capacitors may have transparent electrodes made of ITO, with the upper electrode being in contact with the charge collecting pads by "vias" through the transparent encapsulating material. On the other hand, the array of storage capacitors may have metal electrodes made, for example, of aluminum, titanium, gold, molybdenum or chromium, which electrodes are separated from the scan and readout leads by voids providing light feedthrough.

Also, the TFTs of the array may cover only a small fraction of less than 10% of the pixel area with their source connected to the upper capacitance electrode, their gate connected to the line scan lead and their drain connected to the readout column lead.

The light emitting luminophor covering the rear side of the transparent substrate is preferably a thick X-ray absorbing layer of $Zn_3(PO_4)_2$; $(Zn, Cd) S:Ag$; $YVO_4:Eu$; $Y_2O_3:Eu$; $Y_2O_2S:Eu$ or $Y_2W_3O_{12}:Eu$. Such luminophor can be combined with an X-ray absorbing material, such as gadolinium oxisulfide in a binder, or a tungstate, such as cadmium tungstate or calcium tungstate, in a binder. It can also be combined with a light absorbing material adapted to attenuate and adjust the light fluence delivered to the X-ray to charge converter, such as an organic light absorber dissolved in the binder used to bind the luminophor to the substrate. A light absorbing powder can also be incorporated into the binder of the luminophor for this purpose. Moreover, the red light emitted by the luminophor can be attenuated by a semitransparent layer deposited on the front side of the transparent substrate, which semitransparent layer may be a thin metallic film of titanium, gold, chromium or aluminum.

BRIEF DESCRIPTION OF THE DRAWINGS

A preferred embodiment of the invention will now be described with reference to the appended drawings, in which:

FIG. 1 shows a pin structure of a direct conversion flat panel detector according to prior art;

FIG. 2A and FIG. 2B illustrate the electric field profile in the structure of FIG. 1, before charge trapping and after charge trapping.

DETAILED DESCRIPTION OF THE INVENTION

Figure 3:
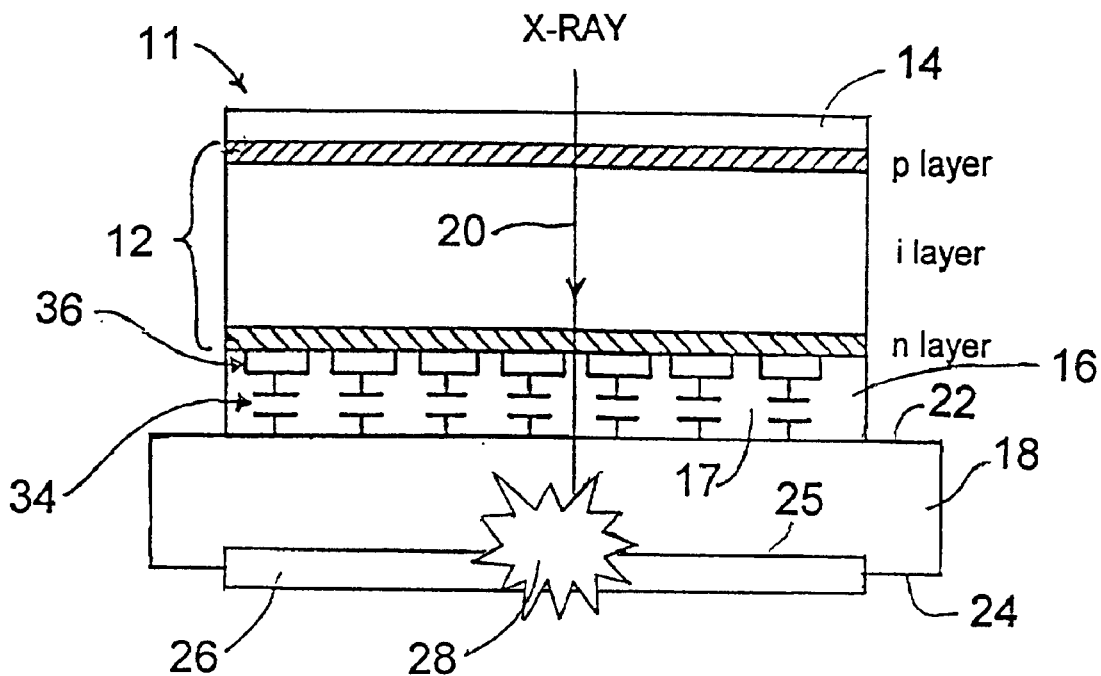
FIG. 3 shows a pin structure of a direct conversion flat panel detector according to the present invention.

The preferred, but non-limitative embodiment of the present invention will now be described in conjunction with the drawings in which the same reference numbers are used to represent the same elements in all figures.

In FIG. 1, a known direct conversion flat panel detector 10 is shown, based on a selenium pin structure. It has a direct converter 12 with a multilayer pin structure where the p and n layers are thin layers of no more than a few micrometers in thickness, and the i layer between the p and n layers is a thick layer of a few hundred or even thousands of micrometers in thickness. Various compositions and thicknesses of such layers are disclosed, for example, in U.S. Pat. No. 5,880,472 of Polischuk et al., which is incorporated herein by reference.

The multilayer selenium converter 12 is provided under a common conducting electrode 14, and is mounted on a TFT array 16 which, itself, is built on a glass substrate 18. When an X-ray beam is directed as shown by arrow 20, the electric field profile of the structure shown in FIG. 1, before any charge trapping, is as shown in FIG. 2A. However, after charge trapping, such electric field profile is considerably modified as shown in FIG. 2B. It is clear, therefore, that trapped charges adversely affect the electric field profile of a direct conversion flat panel detector by producing ghost images.

FIG. 3 illustrates a preferred embodiment of a flat panel detector 11 of the present invention based on a direct multilayer selenium converter 12, under a common conducting electrode 14. The converter 12 is positioned on a TFT array 16 which is placed on a glass substrate 18, the front side 22 of which is connected to the TFT array 16 and the rear side 24 is connected to a luminophor layer 26.

The multilayer selenium converter 12 successively incorporates under the common electrode 14, a thin (2 to 3 $\mu$m) layer p made of doped selenium material, followed by a thick (1000 $\mu$m) layer of selenium alloy, followed by another thin (1 $\mu$m) layer n of doped selenium. The materials and thicknesses of this pin structure given above are given by way of example and are not limitative.

The luminophor 26 provided on the rear side 24 of the glass substrate 18 is adapted to stop the residual transmitted X-ray radiation. In FIG. 3, such radiation proceeds as shown by arrow 20 and is stopped by the luminophor 26 as illustrated by the burst of light 28. Preferably, such luminophor has an emission spectrum within the wavelength range of 580 nm to 620 nm. There is a choice of materials that may be used to produce such luminophor, for example having the following chemical formulae: $Zn_3(PO_4)_2$; (Zn, Cd) S:Ag; $YVO_4$:Eu; $Y_2O_3$:Eu; $Y_2O_2$S:Eu and $Y_2W_3O_{12}$:Eu. The Eu doping with its $Eu^{3+}$ ion has a 611 nm wavelength emission which favorably fits this wavelength range.

A further aspect of the present invention is to combine within the luminophor 26 two materials, one of which is used for X-ray absorption and the other for light emission at the proper wavelength. Thus, one can use, for instance, a combination of gadolinium oxisulfide and yttrium oxisulfide (Eu), the former essentially for its high X-ray stopping power, the latter for its appropriate spectrum emission. These materials are currently used in X-ray film industry and the technology is thus available in thick layers. A 300 mg/cm$^2$ screen with 60% $Gd_2O_2S$ and 40% $Y_2O_2S$ in mole units, in an organic material binder and laminated in a sheet structure, can simply be coupled to the rear side 24 of the transparent glass substrate 18 of the detector 11 to form such luminophor combination designated as 26 in FIG. 3.

Considering an X-ray transmission of 30%, a light transmission through the TFT structure of 30%, a luminophor yield of 5% in watts per watt, a light collection efficiency of 20%, at 1 mR per frame and 30 frames per second, 1.66 E10 light photons per second-cm$^2$ will be absorbed in the selenium multilayer as a result of the back panel luminophor activation. The trapped charges to neutralize are a function of the irradiation and typically equal to about 0.01% of a steady X-ray signal. After one second irradiation at 1 mR per frame and 30 frames per second, the number of charges trapped in deep sites seen through 1 cm$^2$ of detector is in the 1E7 range. The light flux of some 1-E10 delivered by the back detector luminophor is thus sufficient to release the trapped charges.

Since an excess of light can create a background signal, the light flux on the converter may be adjusted in order to deliver a neutralizing light flux sufficient to cancel any ghosting effect, but low enough to avoid any background or pedestal signal. According to another aspect of the invention, this can be obtained by interposing a light absorber between the luminophor 26 and the converter 12 or by adding a light absorber within the luminophor 26.

The light absorber interposed can be a semitransparent film of metal made of titanium, chromium, gold or aluminum, deposited on the rear of the glass support, shown by line 25. If the luminophor is encapsulated in a binder, the latter can be tinted with a colored organic component. It can also contain a light absorbing powder. When combining an X-ray absorber with the luminophor, one can also adjust the mixture in order to control the light flux to the fraction of the signal corresponding to the trapped charges.

The TFT array 16, built on a 1.1 mm thick glass substrate 18, typically has a pitch of 150 $\mu$m. It has an array of storage capacitors 34 connected to switches 36, as shown schematically in FIG. 3.

Figure 4:
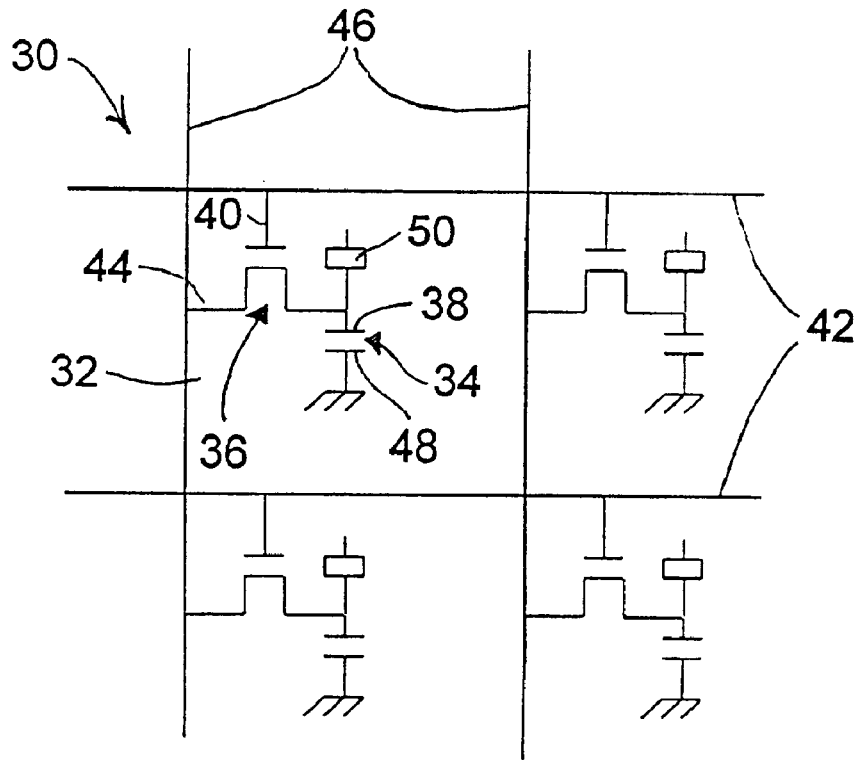
FIG. 4 illustrates the thin film transistor (TFT) matrix structure suitable for the flat panel detector of FIG. 3.
Figure 5:
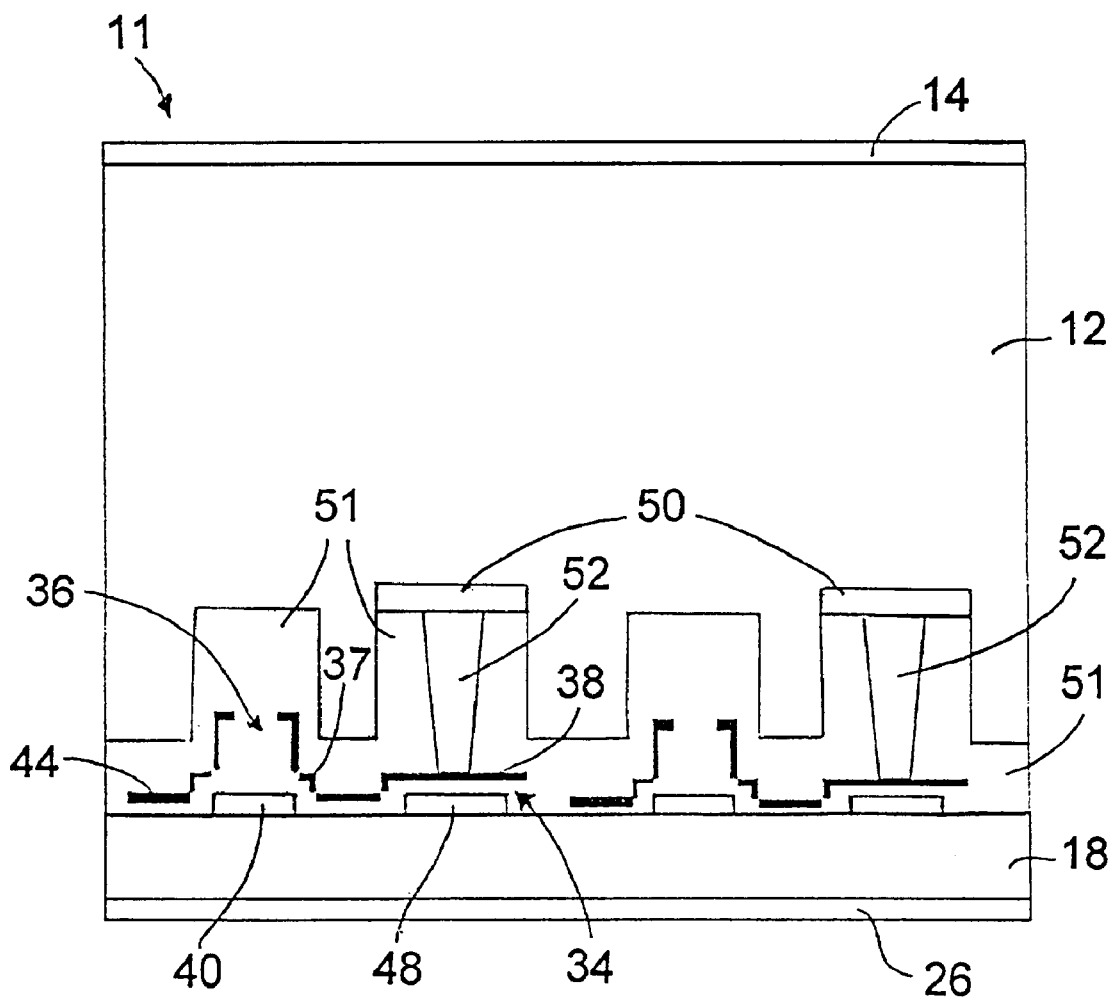
FIG. 5 is a side view of the novel detector structure.

The TFT matrix structure 30 is illustrated in FIG. 4 and its positioning within the detector structure is shown in FIG. 5. Each pixel 32 contains a storage capacitance 34 and a TFT switch 36 with its source 37 connected to the upper capacitance electrode 38, its gate 40 to common gate lines 42 which are common line scan leads, and its drain 44 to common drain lines 46 which are common column readout leads. The bottom electrode 48 of the capacitance 34, preferably made of ITO, is deposited on the glass substrate 18. Alternatively, this electrode 48 can be of the same material as the scan leads, namely chromium, titanium, molybdenum, aluminum or an association of these metals. The upper electrodes 38 of the storage capacitors 34 are in contact with charge collecting transparent conductive pads 50 (preferably made of ITO) by vias 52, through transparent insulator material 51 which encapsulates the TFT array. The amorphous silicon TFT switch 36 covers a small portion of the pixel area, typically of the order of 20×20 $\mu$m$^2$, which only slightly obstructs the transmission of light. Its gate insulator uses silicon nitride, silicon oxide or organic materials. The upper electrode 38 of the storage capacitance 34 is preferably made of transparent ITO. Alternatively it can also use chromium, titanium, molybdenum, aluminum or an association of these metals. If the pixel electrodes are made of metallic material, the voids separating them from the scan and readout leads will insure the transmission of light from the underlying luminophor.

It should be noted that the invention is not limited to the preferred embodiments described above, but various modifications obvious to those skilled in the art can be made without departing from the invention and the scope of the following claims.

What is claimed is:

1. A direct conversion flat panel X-ray detector comprising a direct X-ray to charge converter with a common coplanar electrode, said charge converter being mounted on a readout thin film transistor (TFT) array supported by a transparent substrate, said substrate having a front side on which the TFT array is supported and a rear side opposite to said front side, and a layer of luminophor provided on the rear side of the substrate, said layer of luminophor being adapted to emit light under impact of the transmitted X-ray flux so as to automatically suppress ghost images due to charge trapping within the converter.

2. A detector according to claim 1, in which the TFT array includes a TFT matrix with an array of storage capacitors with a top electrode which collects the charges delivered by the converter and with each TFT source connected to an upper electrode of a corresponding capacitor, and each TFT gate electrode connected to a line scan lead common to all TFT gates of a same line, and each TFT drain connected to a readout column lead common to all TFT drains of a same column.

3. A detector according to claim 1, in which the converter is made of a material selected from the group consisting of a thick layer of cadmium telluride, a thick layer of thallium bromide, a thick layer of lead oxide, a thick layer of cadmium selenide, and a thick layer of amorphous selenium.

4. A detector according to claim 1, in which the converter has a multilayer pin structure where p and n outer layers are thin layers of amorphous selenium and middle i layer is a thick layer of a selenium alloy.

5. A detector according to claim 2, in which the array of storage capacitors and of the readout TFTs are encapsulated in a transparent insulator provided with an array of transparent charge collecting pads made of indium tin oxide.

6. A detector according to claim 5, in which the array of storage capacitors have transparent electrodes made of indium tin oxide, the upper electrode being in contract with the charge collecting pads by vias through the transparent insulator material.

7. A detector according to claim 2, in which the array of storage capacitors have metal electrodes which are separated from the scan and readout leads by voids providing light feedthrough.

8. A detector according to claim 7, in which the metal electrodes are made of aluminum, titanium, gold, molybdenum or chromium.

9. A detector according to claim 2, in which the TFTs of the array cover less than 10% of the pixel area.

10. A detector according to claim 1, in which the layer of luminophor is a thick X-ray absorbing layer of red light emitting luminophor material selected from the group consisting of $Zn_3(PO_4)_2$; (Zn, Cd) S:Ag; $YVO_4$:Eu; $Y_2O_3$:Eu; $Y_2O_2$S:Eu and $Y_2W_3O_{12}$:Eu.

11. A detector according to claim 10, in which the luminophor material is combined with an X-ray absorbing material.

12. A detector according to claim 11, in which the X-ray absorbing material is gadolinium oxisulfide in a binder or a tungstate in a binder.

13. A detector according to claim 12, in which the tungstate is cadmium tungstate or calcium tungstate.

14. A detector according to claim 10, in which the luminophor material is combined with a light absorbing material adapted to attenuate and adjust light fluence delivered to the converter.

15. A detector according to claim 14, in which the light absorbing material is an organic light absorber dissolved in a binder used to bind the luminophor layer to the substrate.

16. A detector according to claim 14, in which the light absorbing material is a light absorbing powder dispersed in a binder used to bind the luminophor layer to the substrate.

17. A detector according to claim 14, in which the light absorbing material is a semitransparent layer deposited on the substrate.

18. A detector according to claim 17, in which said semitransparent layer is a thin metallic film of titanium, gold, chromium or aluminum.

19. A detector according to claim 10, in which the luminophor material has a wavelength between 580 nm and 620 nm.

20. A detector according to claim 1, in which the transparent substrate is made of glass.

* * * * *